United States Patent [19]

Arikawa

[11] Patent Number: 4,559,514
[45] Date of Patent: Dec. 17, 1985

[54] CHIP TYPE FUSE HAVING CONNECTING LEGS

[75] Inventor: Hiroo Arikawa, Tokyo, Japan

[73] Assignee: S.O.C. Corporation, Tokyo, Japan

[21] Appl. No.: 556,689

[22] Filed: Nov. 29, 1983

[30] Foreign Application Priority Data

Dec. 3, 1982 [JP] Japan .................... 57-182601[U]

[51] Int. Cl.⁴ .................................... H01H 85/02
[52] U.S. Cl. .................................... 337/201; 337/252
[58] Field of Search .............. 337/201, 186, 187, 190, 337/213, 216, 227, 251, 252, 253, 295, 297; 174/52 P

[56] References Cited

U.S. PATENT DOCUMENTS

| 3,280,019 | 10/1966 | Harding et al. | 174/52 FP |
| 4,047,143 | 9/1977 | Burden et al. | 337/252 |
| 4,404,536 | 9/1983 | Still | 337/201 |

Primary Examiner—Harold Broome

[57] ABSTRACT

A chip type fuse comprises a fuse base and a cover therefor both made of a heat resistant and electrically insulating material. The fuse includes a pair of electrically conductive terminals, having portions exposed outside of the fuse base and having ends disposed within the fuse. A fusible element is stretched between the ends of the conductive terminals inside the fuse. The fuse base has leg portions extending below the bottom of the base and is adapted to be soldered to a printed circuit board.

4 Claims, 6 Drawing Figures

4,559,514

CHIP TYPE FUSE HAVING CONNECTING LEGS

FIELD OF THE INVENTION

This invention relates to a chip-type fuse and is particularly related to a chip-type fuse having legs for connection to a printed circuit board (PCB).

BACKGROUND OF THE INVENTION

In another application filed concurrently herewith by the present inventor and Yasutada Yuza, applicants described a so-called chip-type fuse (or chip fuse) which does not require lead wires or fuseholders. These chip fuses are extremely miniaturized and especially adapted for use in a printed circuit board (PCB) and, as disclosed in said application, these fuses comprise electrically conductive terminals which have a portion exposed outside the fuse base adapted to be soldered to the PCB. Where overheating of the PCB is not a serious problem, such chip type fuses are satisfactory. In some instances, however, overheating of the PCB could be problematic. This is particularly true when using highly dense electronic circuits which comprise many heat-generating components, such as resistors and transistors which are cramped into a very limited space on the PCB. Frequently in such circuits, the temperature of the PCB could rise to as high as 60° to 70° C. due to the heat generated by the aforementioned components. Thus, if the fuse base is mounted directly on the PCB, the heat generated in the PCB could adversely affect the function of the fuse since the fusible element may melt prematurely at a current which is lower than the rated current of the fuse. In addition, the fuse may deteriorate due to repeated usage over the years.

Another consideration in a chip-type fuse is the optimum amount of solder which is used to solder the conductive terminals to the PCB. If excessive amount of solder is used, the heat capacity of the terminals may vary widely, thus causing dispersion of the blowing time of the fusible element.

Additionally, if the fuse cover is adhesively bonded to the fuse base, the heat generated during soldering may melt the adhesive or destroy its bonding strength. Consequently, some water vapor or other harmful gases may penetrate the fuse base and cause corrosion of the fusible element.

Accordingly, it is an object of the present invention to provide a chip-type fuse which eliminates, or at least minimizes, the aforementioned disadvantages.

It is a further object of this invention to provide a chip-type fuse which does not require lead wires or a fuse-holder when used in a PCB.

The foregoing and other objects, features and advantages of the present invention will be appreciated from the following detailed description and the accompanying drawings.

SUMMARY OF THE INVENTION

In accordance with the present invention, a chip-type fuse is provided which, due to its unique construction, does not require lead wires or fuseholder. The fuse comprises a base and a cover therefor both made of a heat resistant and electrically insulating material. The fuse further comprises a pair of opposed electrically conductive terminals having portions exposed outside the fuse base and have end portions disposed within the fuse which are spaced apart and opposed to one another.

A fusible element is stretched between said inside ends of the conductive terminals and are secured to said ends by solder or other suitable means.

In order to minimize heat conduction to the fuse, the fuse base has descending legs which extend below the bottom of the fuse and which are adapted to be soldered to the PCB by applying the solder to the bottom face of each leg.

Other embodiments of the invention are described in the ensuing detailed description and illustrated in the drawings.

BRIEF DESCRIPTION OF THE DRAWINGS

In the drawings, wherein like numerals are employed to designate like parts.

DETAILED DESCRIPTION OF THE INVENTION

Figure 1:
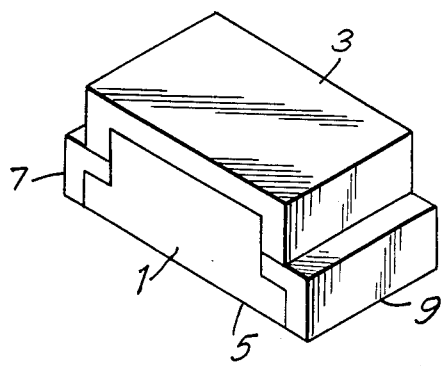
FIG. 1 is a perspective view of a chip-type fuse such as the fuse described in the aforementioned application of Hiroo Arikawa and Yasutada Yuza.

Referring to the drawings, and first to FIG. 1, there is shown a chip-type fuse comprising a fuse base 1 and a fuse cap or cover 3, both made of a heat resistant, electrically insulating material. The fuse base has a bottom 5 and the fuse comprises a pair of electrically conductive terminals 7 and 9. The detailed construction of the chip fuse shown in FIG. 1 is otherwise the same as described in the aforementioned application of Hiroo Arikawa and Yasutada Yuza, therefore, said application is fully incorporated herein by reference.

Figure 2:
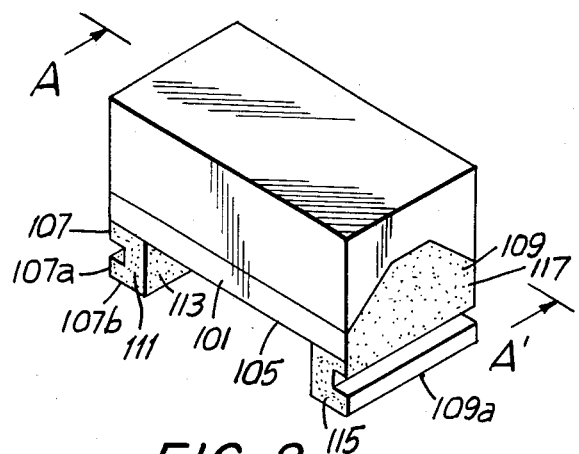
FIG. 2 is a perspective view of a chip-type fuse constructed in accordance with the present invention.

As shown in FIG. 2, the chip fuse of the present invention comprises a fuse base 101 and a fuse cover 103, both made of a heat resistant, electrically insulating material. The fuse chip shown in FIG. 2 also comprises a pair of electrically conductive terminals 107 and 109 which have leg portions 107a and 109a extending below the bottom of the fuse base 101. The conductive terminals 107 and 109 have end portions exposed outside of said fuse base, with their inner ends disposed inside the base. The exposed portions 111 and 113 of conductive terminal 107, and the exposed portions 115, 117 of conductive terminal 109 have applied to their surfaces a coating of anti-soldering material shown in dotted form in FIG. 2. However, no anti-soldering coating is applied to the bottom surfaces 107b and 109b of the respective leg portions 107a and 109a, nor is such material applied to the outside bottom side edges of said terminals as shown in the blank (undotted) portions 119.

Figure 3:
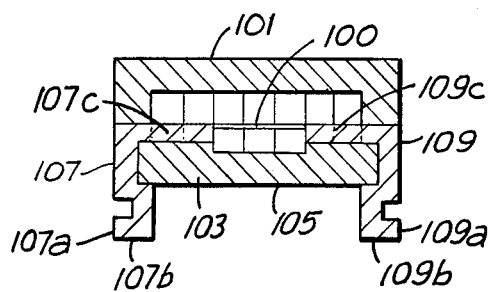
FIG. 3 is a sectional view taken along the lines A—A' of FIG. 2.

As further shown in FIG. 3, the inner ends 107c and 109c of each of the electrically conductive terminals are bent above the base 101 and are inserted in the space formed between the fuse cover 103 and fuse base 101. A fusible element 100 is stretched between said ends 107c and 109c.

Figure 4:
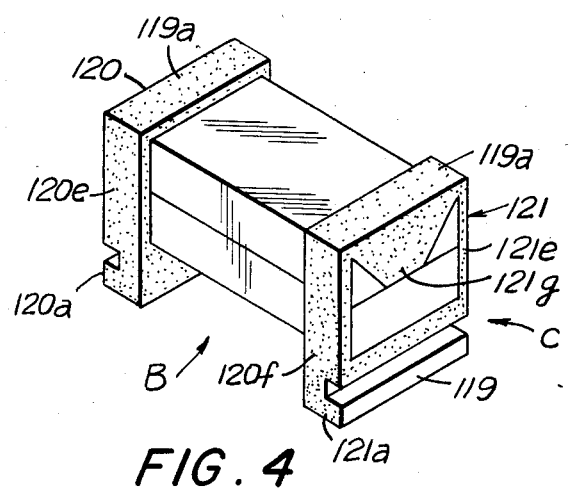
FIG. 4 is a perspective view of another embodiment of the chip-type fuse of this invention.
Figure 5:
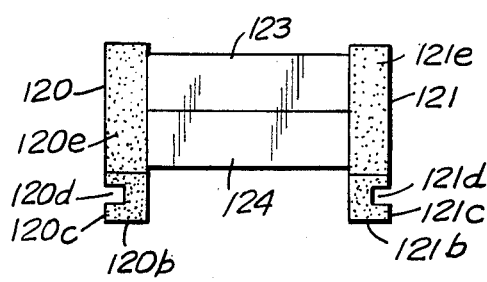
FIG. 5 is a view of the fuse shown in FIG. 4 as seen in the direction of the arrow B.
Figure 6:
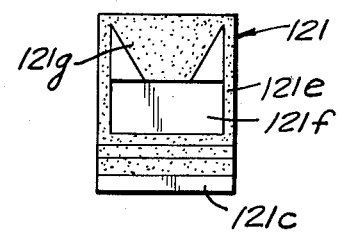
FIG. 6 is a view of the fuse shown in FIG. 4 as seen in the direction of the arrow C.

In the embodiment shown in FIGS. 4–6, the ends of the conductive terminals 120, 121 have downwardly extending leg portions 120a, 121a. A coating of anti-solder material 119a, shown in dotted form, is applied to the exposed portions of the conductive terminals 120, 121 except for their bottom faces 120b, 121b and their outside bottom edges 120c, 121c. The bottom faces 120b, 121b are soldered to the PCB.

The leg portions 120a, 121a each have a slot 120d, 121d which serve to prevent heat conduction to the fuse.

The conductive terminals 120, 121 each have an upper hoop-like frame portion 120e, 121e, forming holes 120f (not shown), 121f within which are held the cover 123 and base 124. The conductive terminals 120, 121 have inwardly bent arm portions 120g (not shown), 121g to which the respective ends of the fusible element is connected and stretched therebetween. The arms 120g, 121g thus correspond in function to the ends 107c, 109c of the conductive terminals in the embodiment illustrated in FIGS. 2 and 3.

As is evident from the foregoing detailed enclosure, the present invention provides an extremely miniaturized fuse which does not require lead wires or fuseholder and which affords the advantages heretofore described. While the fuse of this invention has been described with some degree of particularity, several changes may be in its construction which are obvious from the present disclosure and which are nevertheless within the scope of the invention.

What is claimed is:

1. A chip fuse comprising a base and a cover therefor both made of a heat resistant and electrically insulating material; a pair of electrically conductive terminals having portions exposed outside of said base and ends disposed within said base in opposed relationship to one another, each of said conductive terminals having a leg portion extending below said base and each of said leg portions having a bottom face adapted to be soldered to a printed circuit board and a fusible element secured to each end of said conductive terminals inside said fuse base, wherein each of said electrically conductive terminals have hoop-like frame portions having a hole therethrough and the opposite ends of said base and cover are held, and clamped together, by said frame portions and within the said holes.

2. A chip fuse as in claim 1 wherein a coating of anti-soldering material is applied to the outer surfaces of said conductive terminals except to the bottom faces thereof.

3. A chip fuse as in claim 1 wherein said fusible element is secured, by soldering means, to each end of said conductive terminals inside said fuse base.

4. A chip type fuse as in claim 2 wherein said fusible element is secured, by soldering means, to each end of said conductive terminals inside said fuse base.

* * * * *